United States Patent [19]

Strobach

[11] Patent Number: 5,546,332
[45] Date of Patent: Aug. 13, 1996

[54] PROCESS FOR COMPENSATING FOR QUASI-PERIODIC DISTURBANCES OF MEASUREMENT SIGNALS

[75] Inventor: Peter Strobach, Röhrnbach, Germany

[73] Assignee: Siemens Aktiengesellschaft, Munich, Germany

[21] Appl. No.: 190,160

[22] PCT Filed: Jun. 30, 1992

[86] PCT No.: PCT/DE92/00539

§ 371 Date: Feb. 7, 1994

§ 102(e) Date: Feb. 7, 1994

[87] PCT Pub. No.: WO93/03544

PCT Pub. Date: Feb. 18, 1993

[30] Foreign Application Priority Data

Aug. 9, 1991 [DE] Germany .......................... 41 26 463.0

[51] Int. Cl.$^6$ ...................................................... G06F 15/31
[52] U.S. Cl. ........................................... 364/572; 364/574
[58] Field of Search .............................. 364/572, 724.19, 364/574, 575; 455/307; 333/166, 173; 128/733; 73/579

[56] References Cited

U.S. PATENT DOCUMENTS

| | | | |
|---|---|---|---|
| 4,964,411 | 10/1990 | Johnson et al. | 128/733 |
| 5,029,118 | 7/1991 | Nakajima et al. | 364/572 |
| 5,152,172 | 10/1992 | Leon et al. | 73/579 |

FOREIGN PATENT DOCUMENTS 9002447  3/1990  WIPO .

OTHER PUBLICATIONS

"Canceling the Cardiogenic Artifact in Impedance Pneumography", A. V. Sahakian et al, IEEE Seventh Annual Conference of the Engineering in Medicine & Biology Society, (1985), New York, pp. 855–859.

"Adaptive Filtering of Evoked Potentials", N. V. Thakor, IEEE Transactions on Biomedical Engineering, vol. 34, No. 1, Jan. 1987, New York, pp. 6–12.

"Adaptive Noise Canceling for Speech Signals", M. R. Sambur, IEEE Transactions on Acoustics, Speech and Signal Processing, vol. 26, No. 5, Oct. 1978, pp. 419–423.

*Primary Examiner*—Emanuel T. Voeltz
*Assistant Examiner*—M. Kemper
*Attorney, Agent, or Firm*—Hill, Steadman & Simpson, A Professional Corporation

[57] ABSTRACT

To compensate for quasi-periodic disturbances in measurement signals, the wanted signal is separated from the disturbing signal by determining from an auxiliary signal a series of trigger instants, and estimating from this measurement signal a disturbing signal template, by furthermore generating from this disturbing signal template a trigger-synchronous reference signal, and by using this trigger-synchronous reference signal for filtering the measurement signal. The process can be carried out both after the recording of a complete measurement data set and at the same time as the recording of such a measurement data set. The process is suitable in particular for compensating for cardio-interference during magneto-encephalography.

11 Claims, 2 Drawing Sheets

PROCESS FOR COMPENSATING FOR QUASI-PERIODIC DISTURBANCES OF MEASUREMENT SIGNALS

BACKGROUND OF THE INVENTION

In many areas of measuring technology and data acquisition, a desired wanted signal is superimposed with an undesired disturbing signal. This phenomenon is generally referred to as interference. It is often not possible to achieve an adequate reduction in the effect of the disturbing signal by suitable modification of the physical measuring conditions. In such cases, it is attempted to compensate for the interference after the data acquisition by methods of adaptive digital signal processing in the measurement signal with the incorporation of a reference signal of the disturbance (interference compensation). A particular difficulty occurs if significant proportions of the disturbance are not contained in the reference signal. In such cases, the known processes for adaptive interference compensation fail.

FIG. 1 shows in a diagrammatic way the previously known approach to interference compensation (B. Widrow and S. D. Stearns: "Adaptive Signal Processing", Prentice-Hall, Englewood Cliffs, N.J., 1985). In the case of these known processes, it is assumed that an "observation" of the disturbing signal is available in the form of a reference signal n'. An adaptive filter forms a linear or nonlinear combination of a number of temporally successive values of the reference signal n'. This adaptively preprocessed reference signal is then subtracted from the disturbed measurement signal s+n. The parameters of the linear or nonlinear adaptive filter are in this case set such that the energy of the output signal E assumes a minimum. Consequently, the disturbing signal component in the output signal is minimized in accordance with the method of least squares (B. Widrow 1985).

The classical approach to interference compensation hereby described is based on the implicit assumption that all the components of the interference can be represented by suitable linear or nonlinear compensations of a reference signal. The classical approach fails, or supplies inadequate compensation results, if this prerequisite is not met, i.e. if significant components of the disturbance are not depicted in the reference signal.

SUMMARY OF THE INVENTION

In those cases in which the reference signal does not supply reliable information on the true progression of the interference, reliable information on the signal form of the interference must be obtained in another way. The invention is based on the object of specifying a process for interference compensation for a special case of interference, the case of so-called quasi-periodic interference, that is to say an interference signal characteristic which recurs periodically, both the period and the signal form being subject to stochastic variations.

This object is achieved by a process for separating a wanted signal, contained in a measurement signal, from a disturbing signal, likewise contained in this measurement signal.

In general terms the steps of the process of the present invention are as follows:

a) determination of a series of trigger instants from an auxiliary signal;

b) estimation of a disturbing signal template by trigger-synchronous averaging of the measurement signal;

c) generation of a trigger-synchronous reference signal from the disturbing signal template; and d) filtering of the measurement signal with the aid of the trigger-synchronous reference signal.

In the case of quasi-periodic interference, there is namely usually an auxiliary signal available, from which the instantaneous period of the interference can be derived. Such an auxiliary signal can often be derived from a further measurement signal. In medical applications, it may be derived, for example, from the electro-cardiogram or electro-encephalogram. In the case of other applications, such an auxiliary signal can be derived under certain circumstances from the measurement signal itself by suitable trigger circuits. Consequently, the repetition instances of the interference signal in the measurement signal are known. An estimation of the signal characteristic of the interference is then obtained by interference-synchronous averaging of the measurement signal for the entire measurement data set. The estimation obtained in this way of the signal characteristic of a period of the interference is entered into a reference memory. In a second phase, the adaptive filtering finally takes place with the basic circuit shown in FIG. 1, although the content of the reference memory serves as reference signal n', the estimated interference signal characteristic being read out periodically and interference-synchronously from said memory. The reference signal fed directly into the adaptive filter (FIG. 1) in the conventional approach merely supplies the information on the instantaneous period of the source of the disturbance in the case of the solution according to the invention. Thus, the cyclically and interference-synchronously read-out content of the reference memory serves as the valid reference signal for the adaptive filtering.

When carrying out the process, first of all the auxiliary signal is used to determine a series of trigger instants and a disturbing signal template is estimated. From this disturbing signal template, a trigger-synchronous reference signal is generated. By adaptive filtering of the measurement signal with the aid of the trigger-synchronous reference signal, finally the wanted signal is separated from the disturbing signal.

Advantageous further developments of the invention are as follows.

The trigger-synchronous averaging of the measurement signal takes place with consideration of all the data of a series of measurements after completion of the series of measurements.

The trigger-synchronous averaging of the measurement signal takes place while the series of measurements is in progress, by a) setting at each trigger instant a pointer of a means for sequential storage of the disturbing signal template with a multiplicity of memory elements to a starting point of this storing means, b) overwriting the content of the memory element to which the pointer is set at that instant with the sum of the instantaneous content of this memory element, multiplied by a factor, and the instantaneous value of the measurement signal, and c) subsequently setting the pointer to a following memory element.

The wanted signal is separated from the disturbing signal by serial adaptive filtering of the measurement signal. A linear combination of values of the trigger-synchronous reference signal, the coefficients of which are determined adaptively by the minimization of an error function, is subtracted from the measurement signal. The error function is an averaged difference from the measurement signal and the linear combination of values of the trigger-synchronous reference signal.

The trigger-synchronous reference signal is generated from the disturbing signal template by repeated, trigger-synchronous arrangement in series of the disturbing signal template with use of a mixing function to ensure attributes of constancy of the trigger-synchronous reference signal at the point of connection of the arrangement in series.

The repeated trigger-synchronous arrangement in series of the disturbing signal template takes place, by a) setting at every trigger instant a pointer of a means for the sequential storage of the disturbing signal template with a multiplicity of memory elements to a starting point of this storing means, b) multiplying the content of the memory element to which the pointer is set at that instant by the value of a mixing function belonging to this memory element, c) multiplying the content of a further memory element, the address of which is in a fixed relationship, defined by an offset, with the address of the memory element to which the pointer is pointing at that instant, by the value of the same mixing function belonging to this further memory element, d) adding the contents of the memory elements multiplied by values of the mixing function, e) outputting the sum as an instantaneous trigger-synchronous reference signal, and f) subsequently setting the pointer to a following memory element.

The disturbing signal template is repeatedly arranged in series in such a way that the point of connection coincides with an inactive region of the disturbing signal template.

The process is used for compensating for cardio-interference during magneto-encephalography, the auxiliary signal being derived from an electro-cardiogram. Also for compensating for cardio-interference during magneto-encephalography, the point of connection coincides with a point in time shortly before the atrial stimulation commences.

In a preferred embodiment of the invention, the disturbing signal template is estimated from the measurement signal by a trigger-synchronous averaging of the measurement signal. In this case, it is possible to carry out the trigger-synchronous averaging with consideration for all the data of a series of measurements after completion of the series of measurements. Alternatively to this, it is similarly possible to carry out the trigger-synchronous averaging of the measurement signal while the series of measurements is in progress. This variant of the process makes the process suitable also for real-time application.

The process is suitable in particular for use in the filtering of medical measurement data, such as for example compensating for cardio-interference during magneto-encephalography, the auxiliary signal being derived from the electro-cardiogram.

Quite generally it is advantageous to generate the trigger-synchronous reference signal from the interference signal template by a repeated, trigger-synchronous arrangement in series of the interference signal template with use of a mixing function to ensure attributes of constancy of the trigger-synchronous reference signal at the point of connection of the arrangement in series. In medical applications to compensate for cardio-interference during magneto-encephalography, it is particularly advantageous if the point of connection of this arrangement in series coincides with a point in time shortly before atrial stimulation commences.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 6 is a flowchart depicting the method of the present invention.

DESCRIPTION OF THE PREFERRED EMBODIMENT

The invention is described in more detail below with reference to a preferred illustrative embodiment and also with the aid of the figures.

The process for interference compensation can be carried out in principle by two different methods of operation. In the case of a first process variant, all the measurement data of the series of measurements are stored in a memory of a digital computer. Apart from the actual measurement signal, an auxiliary signal HS is recorded (for example an ECG signal), from which the instantaneous period of the interference, or its repetition instants (trigger instants) can be determined by triggering. In this variant, the process comprises two process steps, each of which requires processing of the entire data set. The flowchart depicted in FIG. 6 sets forth the steps of the process.

In the first process step, the repetition instants of the disturbing signal are determined from the also recorded auxiliary signal HS by suitable triggerings (for example threshold value formation with the aid of a Schmitt trigger). At the same time, the measurement signal is averaged synchronously with respect to the trigger in a reference memory.

In the second process step, the reference memory content is read out synchronously with the recorded trigger. In this way an artificial reference signal is generated. This artificial reference signal is fed together with the measurement data to undergo interference suppression to an adaptive filter, which finally carries out the interference suppression.

Figure 1:
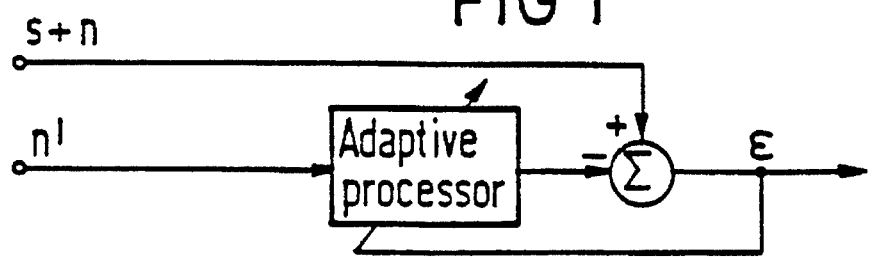
FIG. 1 describes the structure of an adaptive filter for interference compensation.
Figure 2:
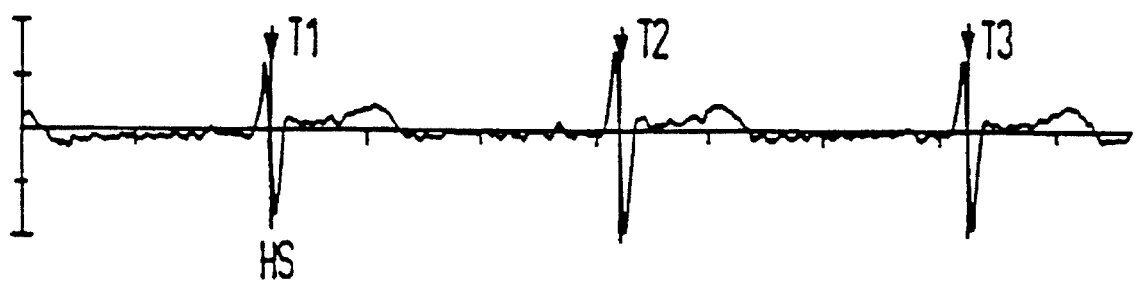
FIG. 2 shows the time characteristic of a typical auxiliary signal of a quasi-periodic source of disturbance and the associated trigger instants.
Figure 3A:
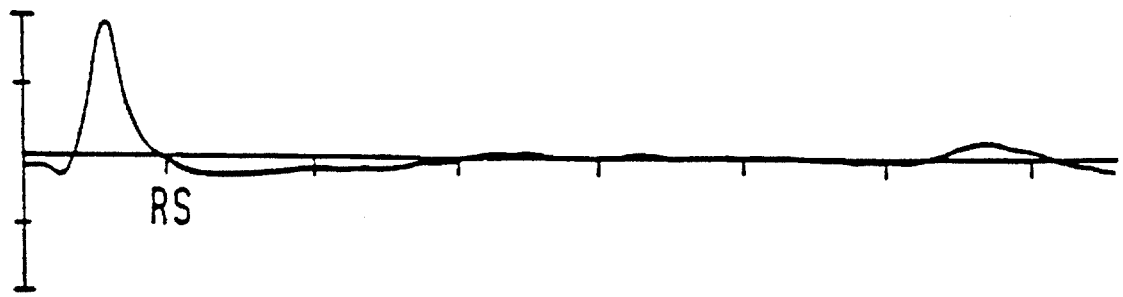
FIGS. 3a and 3b show a period of the reference signal and the associated content of the reference memory after 150 trigger-synchronous averagings of the measurement signal.
Figure 3B:
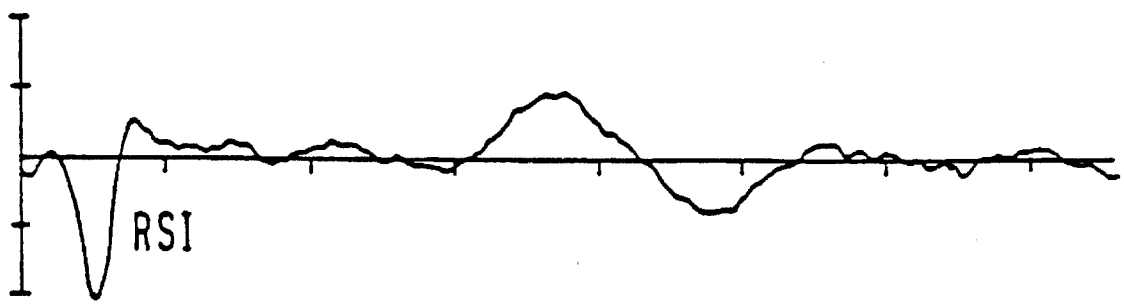

First process step:

FIG. 2 shows a typical signal characteristic of an auxiliary signal HS for a quasi-periodic source of disturbance (example ECG signal). The instantaneous period can be determined from the characteristic of this auxiliary signal HS by a suitable trigger process. In the first process step, the trigger instants are determined for the entire data set. At the same time, the measurement signal is averaged synchronously with respect to the trigger in a reference memory. FIGS. 3a and 3b show a period of the reference signal RS and the associated content of the reference memory RSI after averaging 150 periods of the measurement signal. A sinusoidal signal component, which is not depicted in the reference signal, can be clearly seen in the middle of the reference memory. The content of the reference memory RSI can be interpreted as an estimate of the true disturbing signal component (interference) in the measurement signal.

Figure 4:
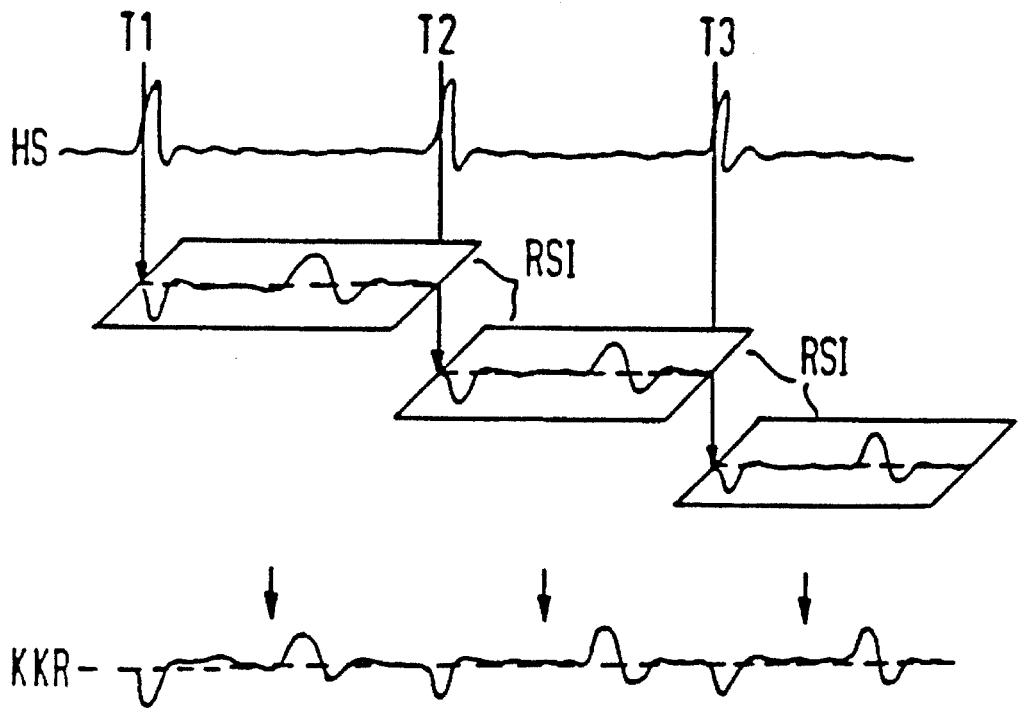
FIG. 4 shows the principle of generating an artificial reference signal of the interference by trigger-synchronous periodic continuation of a reference memory content.

Second process step:

In the second process step, the reference memory content is periodically continued trigger-synchronously. FIG. 4 illustrates this operation of periodic continuation of the reference memory content, whereby an artificial reference signal is generated. A smooth transition from the end to the beginning of the reference memory is to be ensured in every period. This is accomplished by the following measures:
1. Beginning and end of the reference memory are to coincide as far as possible with largely inactive regions of the averaged measurement signal.
2. A continuous transition from the end to the beginning of the reference memory is to be realized (mixing function MF).

Figure 5:
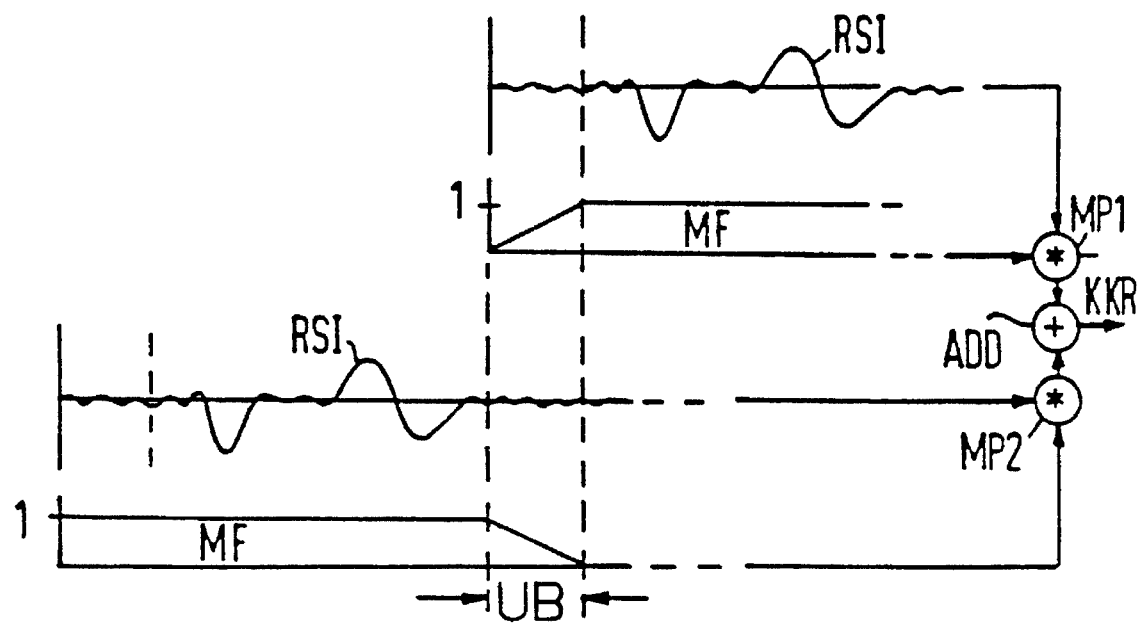
FIG. 5 diagrammatically shows the generation of an artificial continuous reference signal by repeated reading out of a reference memory content with incorporation of a linear mixing function.

FIG. 5 illustrates the generation of a continuous artificial reference signal by repeated reading out of a reference memory content with incorporation of a linear mixing function MF. The continuous reference signal obtained in this way is fed to an adaptive filter. At a second input of the adaptive filter, the measurement data are fed in. The adaptive filter forms a linear combination of temporarily successive sampled values of the reference signal and consequently compensates for temporal fluctuations of the interference and also the temporal uncertainty of the trigger. As FIG. 5 shows, in this case the mixing function is incorporated by the reference memory content being multiplied by the mixing function, as represented in FIG. 5. Since the mixing function is of such a nature that addition of its values at the end of one period together with its values at the beginning of the next period produces 1, in this way a convex linear combination of the contents of the reference memory is formed by the addition represented in FIG. 5. As a result, a continuous connection of the reference memory content is ensured at the transition from one period to the next period.

A second variant of this process for interference compensation in the case of quasi-periodic interferences is not designed for off-line processing but for on-line processing. It therefore does not require the recording of a complete measurement data set and also does not require two separate runs through the measurement data. Instead of this, the content of the reference memory is updated at the transition from one period to the next period with the aid of an exponential forget factor a. a is a factor of which the values can move between 0 and 1, a typical value being about 0.99. With the aid of this exponential forget factor, the content of a memory element of the reference memory at the period k can be calculated from the content of the same reference memory element at the period k−1 by this older reference memory content at the period k−1 being multiplied by the factor a and by the instantaneous value of the reference signal being added to this multiplied value.

At the start, the process requires a certain run-up time until a stable estimation of the interference signal characteristic has developed in the reference memory. This run-up time is typically 50 to 100 periods of the disturbing signal.

The process may be used particularly advantageously for compensating for cardio-interference in magneto-encephalograms (MEGs). The magneto-encephalogram is based on the measurement of an extremely weak magnetic field distribution which is generated by a pathological center (able to be modeled as a power source) in the brain of a patient. The magnetic field distribution is measured with the aid of a highly sensitive sensor array, the sensors of which supply the MEG measurement signals.

The magnetic field distribution produced by the pathological activity in the brain of the patient is superposed by a nonshieldable interference field, which is caused by the cardiac activity of the patient. The MEG measurement signal can therefore be imagined as the superposition of three signal components:
1. Measurement noise
2. MEG wanted signal (consequence of the magnetic field distribution to be measured)
3. Cardio-interference (consequence of the quasi-periodic alternating field caused by the cardiac activity of the patient).

The ECG of the patient is available as additional information on the cardio-interference. By a suitable trigger process, the instantaneous period of the cardio-interference can be determined from the ECG. Consequently, the process described in this application for an invention can be used for compensating for cardio-interference.

In any event, in the case of both process variants, a series of trigger instants (T1, T2, T3, . . .) is determined from an auxiliary signal and a disturbing signal template is estimated from the measurement signal. This preferably takes place by a trigger-synchronous averaging of the measurement signal. In the one process variant, this trigger-synchronous averaging of the measurement signal takes place with consideration of all the data of a series of measurements after completion of the series of measurements. In another process variant, which is suitable for real time or on-line operation, this trigger-synchronous averaging of the measurement signal takes place while the series of measurements is in progress, preferably by setting at each trigger instant a pointer to memory elements of the reference memory to the starting point of this reference memory, by overwriting the content of that memory element of the reference memory to which the pointer is set at that instant with the sum of the instantaneous content of this memory element, multiplied by a factor, and the instantaneous value of the measurement signal, and by subsequently setting the pointer to a following memory element of the reference memory.

After the estimation of the disturbing signal template, the latter is used to generate a trigger-synchronous reference signal KKR, which is used for the adaptive filtering of the measurement signal, In this case, preferably a linear combination of values of the trigger-synchronous reference signal, the coefficients of which are determined adaptively by the minimization of an error function, is subtracted from the measurement signal. An averaged difference from the measurement signal and the linear combination of values of the trigger-synchronous reference signal is particularly suitable as the error function.

In order to ensure the constancy of the trigger-synchronous reference signal at the points of connection between two periods, it is particularly advantageous if the trigger-synchronous reference signal is generated from the disturbing signal template by repeated trigger-synchronous arrangement in series of the disturbing signal template with use of a mixing function at the point of connection $\overline{UB}$ of the arrangement in series. This repeated trigger-synchronous arrangement in series of the disturbing signal template takes place particularly advantageously by setting at each trigger instant T1, T2, T3, ... a pointer to a memory element of the reference memory to a starting point of the reference memory, by multiplying the content of the memory element to which the pointer is set at that instant by the value of a mixing function belonging to this memory element and by multiplying the content of a further memory element, the address of which is in a fixed relationship, defined by an offset, with the address of the memory element to which the pointer is pointing at that instant, by the value of the same mixing function belonging to this further memory element, by adding the contents of the memory elements multiplied by values of the mixing function, by outputting the sum as an instantaneous trigger-synchronous reference signal, and by subsequently setting the pointer to a following memory element.

The attributes of constancy of the trigger-synchronous reference signal KKR are further improved if the disturbing signal template is repeatedly arranged in series in such a way that the point of connection coincides with an inactive region of the disturbing signal template. This is evident in particular from a consideration of FIGS. 3a, b, 4 and 5. In applications of the process for compensating for cardio-interference in magneto-encephalography it is therefore particularly advantageous if the point of connection coincides with a point in time shortly before the atrial stimulation commences.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A process for separating a wanted signal, contained in a measurement signal, from a quasi-periodic disturbing signal, likewise contained in a measurement signal, comprising the steps of:
    a) determining a series of trigger instants from an auxiliary signal,
    b) estimating a disturbing signal template by trigger-synchronous averaging of the measurement signal with respect to said trigger instants, whereby the measurement signal is repeatedly superimposed on itself and temporal progression thereof is averaged to obtain a characteristic representative of the measurement signal in order to estimate the disturbing signal template,
    c) generating a trigger-synchronous reference signal from the disturbing signal template with respect to said trigger instants,
    d) filtering the measurement signal with the aid of the trigger-synchronous reference signal to thereby separate the wanted signal from the disturbing signal.

2. The process as claimed in claim 1, wherein the trigger-synchronous averaging of the measurement signal takes place using all data of a series of measurements after completion of the series of measurements.

3. The process as claimed in claim 1, wherein the trigger-synchronous averaging of the measurement signal takes place while a series of measurements is in progress, by
    a) setting at each trigger instant a pointer of a means for sequential storage of the disturbing signal template with a multiplicity of memory elements to a starting point of this storing means,
    b) overwriting a content of a respective memory element to which the pointer is presently set with a sum of an instantaneous content of this memory element, multiplied by a factor, and an instantaneous value of the measurement signal, and
    c) subsequently setting the pointer to a memory element following the respective memory element.

4. The process as claimed in claim 1, wherein the wanted signal is separated from the disturbing signal by serial adaptive filtering of the measurement signal.

5. The process as claimed in claim 4, wherein a linear combination of temporal successively sampled values of the trigger-synchronous reference signal, coefficients of which are determined adaptively by minimization of an error function, is subtracted from the measurement signal.

6. The process as claimed in claim 5, wherein the error function is an averaged difference of the measurement signal and the linear combination of the temporal successively sampled values of the trigger-synchronous reference signal.

7. The process as claimed in claim 1, wherein a series of trigger-synchronous arrangements have points of connections between adjacent trigger, synchronous arrangements, and wherein the trigger-synchronous reference signal is generated from the disturbing signal template by using a mixing function at said points of connection such that said series of trigger-synchronous arrangements forms said trigger-synchronous reference signal.

8. The process as claimed in claim 7, wherein the repeated trigger-synchronous arrangement in series of the disturbing signal template takes place, by
    a) setting at every trigger instant a pointer of a means for the sequential storage of the disturbing signal template with a multiplicity of memory elements to a starting point of this storing means,
    b) multiplying a content of a respective memory element to which the pointer is presently set by a value of a mixing function belonging to this memory element,
    c) multiplying a content of a further memory element, an address of which is in a fixed relationship, defined by an offset, with an address of the respective memory element to which the pointer is presently pointing, by a value of the same mixing function belonging to this further memory element,
    d) adding the contents of the respective memory element and the further memory element multiplied by values of the mixing function,
    e) outputting a sum as an instantaneous trigger-synchronous reference signal, and
    f) subsequently setting the pointer to a memory element following the respective memory element.

9. The process as claimed in claim 7, wherein the disturbing signal template is repeatedly arranged in series such that a point of connection coincides with an inactive region of the disturbing signal template.

10. The process as claimed in claim 1, wherein for compensating for cardio-interference during magneto-encephalography, the auxiliary signal is derived from an electro-cardiogram.

11. The process as claimed in claim 9, wherein for compensating for cardio-interference during magneto-encephalography, the point of connection coincides with a point in time shortly before atrial stimulation commences.

* * * * *